United States Patent
Yamasaki et al.

(10) Patent No.: US 10,299,417 B2
(45) Date of Patent: May 21, 2019

(54) ELECTROMAGNETIC SHIELDING TUBE AND ELECTROMAGNETIC SHIELDING STRUCTURE

(71) Applicants: FURUKAWA ELECTRIC CO., LTD., Tokyo (JP); FURUKAWA AUTOMOTIVE SYSTEMS INC., Shiga (JP)

(72) Inventors: Masanori Yamasaki, Shiga (JP); Tatsuya Yuasa, Shiga (JP); Katsutoshi Sakai, Shiga (JP); Akihiro Nagao, Shiga (JP)

(73) Assignees: FURUKAWA ELECTRIC CO., LTD., Tokyo (JP); FURUKAWA AUTOMOTIVE SYSTEMS INC., Shiga (JP)

(*) Notice: Subject to any disclaimer, the term of this patent is extended or adjusted under 35 U.S.C. 154(b) by 14 days.

(21) Appl. No.: 15/708,498

(22) Filed: Sep. 19, 2017

(65) Prior Publication Data
US 2018/0007816 A1    Jan. 4, 2018

Related U.S. Application Data

(63) Continuation of application No. PCT/JP2016/059582, filed on Mar. 25, 2016.

(30) Foreign Application Priority Data

Mar. 27, 2015   (JP) .................................. 2015-066733
Mar. 27, 2015   (JP) .................................. 2015-066812
(Continued)

(51) Int. Cl.
H05K 9/00   (2006.01)
H01B 7/04   (2006.01)
(Continued)

(52) U.S. Cl.
CPC ............. *H05K 9/0049* (2013.01); *H01B 7/04* (2013.01); *H01B 17/62* (2013.01); *H01R 9/0518* (2013.01);
(Continued)

(58) Field of Classification Search
CPC .................................................. H05K 9/0098
See application file for complete search history.

(56) References Cited

U.S. PATENT DOCUMENTS

2001/0048983 A1 * 12/2001 Yoshida ............... H02G 3/0481
                                                                428/34.1
2005/0098342 A1    5/2005 Sakabe et al.
(Continued)

FOREIGN PATENT DOCUMENTS

EP      2541706 A2    1/2013
JP      S6119012 A    1/1986
(Continued)

OTHER PUBLICATIONS

International Search Report issued in PCT/JP2016/059582, dated Jun. 14, 2016.

*Primary Examiner* — Hung V Ngo
(74) *Attorney, Agent, or Firm* — Marshall, Gerstein & Borun LLP

(57) ABSTRACT

The outer layer is peeled exactly a predetermined length from the end portion of the electromagnetic shielding tube. That is, the metal layer is exposed exactly a predetermined range at the end portion of the electromagnetic shielding tube. A flexible conductor is connected to the exposed metal layer. A separated portion is provided in the inner layer. The separated portion is formed along the length direction of the electromagnetic shielding tube. Additionally, a depth of the separated portion is the same value as the thickness of the inner layer. As such, the inner surface of the metal layer is exposed at the separated portion. It is preferable that the
(Continued)

separated portion be formed at a plurality of locations in the circumferential direction. The inner layer is divided into a plurality of sections in the circumferential direction by the separated portion. The separated portion is a terminal processed portion, which mitigates the effects caused by differences in the physical properties of the inner layer and the metal layer.

14 Claims, 12 Drawing Sheets

(30) Foreign Application Priority Data

Mar. 27, 2015 (JP) .................................. 2015-066871
Mar. 27, 2015 (JP) .................................. 2015-066926

(51) Int. Cl.
*H01B 17/62* (2006.01)
*H01R 9/05* (2006.01)
*H02G 15/068* (2006.01)
*H01R 4/28* (2006.01)
*H01R 4/60* (2006.01)
*H01R 11/12* (2006.01)

(52) U.S. Cl.
CPC ......... *H02G 15/068* (2013.01); *H05K 9/0045* (2013.01); *H05K 9/0084* (2013.01); *H05K 9/0098* (2013.01); *H01R 4/28* (2013.01); *H01R 4/60* (2013.01); *H01R 11/12* (2013.01)

(56) References Cited

U.S. PATENT DOCUMENTS

2013/0306346 A1* 11/2013 Izawa .................. H02G 3/0468
174/102 R
2013/0341060 A1  12/2013 Kozawa et al.
2015/0237770 A1   8/2015 Yamasaki et al.

FOREIGN PATENT DOCUMENTS

| JP | U11988039828 | 3/1988 |
| JP | H09298382 A | 11/1997 |
| JP | 2002042571 A | 2/2002 |
| JP | 2002357284 A | 12/2002 |
| JP | 2004-215494 A | 7/2004 |
| JP | 2007081158 A | 3/2007 |
| WO | WO-2013190682 A1 | 12/2013 |
| WO | WO-2014034665 A1 | 3/2014 |

\* cited by examiner

ELECTROMAGNETIC SHIELDING TUBE AND ELECTROMAGNETIC SHIELDING STRUCTURE

TECHNICAL FIELD

The present disclosure relates to an electromagnetic shielding tube and the like through which an electric wire is inserted, for use in, for example, an electric automobile.

BACKGROUND

Conventionally, metal tubes such as steel tubes or aluminum pipes, or corrugated tubes made of resin are used as cable protecting tubes. With such cable protecting tubes, problems may occur such as the influence of noise generated by the cable housed in the protecting tube or the influence of external noise on the cable inside the protecting tube. For example, in hybrid automobiles, in order to protect the cable that supplies three-phase AC output from the inverter to the drive motor, a protecting tube is provided in the lower portion and the like of the vehicle body so as to fit the shape of the vehicle body. However, in this case, noises generated by the cable disrupt the radio and the like and, therefore, shielding is necessary.

Protecting tubes made have been proposed that include a metal tube made of metal, for which the outermost layer is made of stainless steel to improve durability and the other layers are made of iron (see Japanese Unexamined Patent Application Publication No. 2007-81158A).

Additionally, corrugated tubes have been proposed in which a metal layer is plated on a corrugated tube made of resin (see Japanese Unexamined Patent Application Publication No. H09-298382A).

However, the metal tube in Japanese Unexamined Patent Application Publication No. 2007-81158A is made of metal and, thus, has a problem of weight. If the thickness of the metal tube is decreased to reduce the weight, the bent portion may collapse and flatten when bending the tube, thereby making it difficult to maintain the predetermined internal diameter. Additionally, since a certain thickness is required, a large processing machine is needed for the bending. As such, workability during the product shaping process is not always good.

Also, particularly in electric automobiles, electromagnetic shielding tubes are usually disposed in the lower portion of the vehicle and, as such, corrosion resistance against moisture and external damage resistance against flying rocks and the like are required. However, with the metal tubes described above, there is a high possibility of dents being formed when flying rocks or the like collide with the outer surface of the tube. Additionally, costs increase when using stainless steel, such as in Japanese Unexamined Patent Application Publication No. 2007-81158A. Moreover, with such protecting tubes, not only is there a possibility of water becoming adhered to the outside of the tube, but there is also a possibility of water becoming adhered to the inside the tube due to condensation and the like. Consequently, forming a stainless layer only on the outermost layer does not completely solve the problem of corrosion.

Additionally, even when using a method in which a metal layer is adhered to the corrugated tube by plating as described in Japanese Unexamined Patent Application Publication No. H09-298382A, there are problems with peeling, corrosion, and the like of the plating.

With electric automobiles in particular, due to the fact that substantial levels of noise are generated, there is a possibility of other electrical components being affected. However, with the method described in Japanese Unexamined Patent Application Publication No. H09-298382A in which a metal layer is formed on a corrugated tube made of resin using an electroless plating method, there is a limit to the shielding properties that can be obtained from the thickness of the metal layer. Consequently, it is difficult to achieve both high shielding properties and adhesion between the metal layer and the resin layer.

In contrast, composite tubes have been proposed in which resin layers are formed as the inner and outer layers of a metal layer. With a configuration in which the inner and outer layers are resin layers and the intermediate layer is a metal layer, the metal layer is not exposed on the inner surface and the outer surface of the electromagnetic shield tube and, thus, corrosion of the electromagnetic shield can be prevented. Additionally, flattening of the metal layer when bending the electromagnetic shielding tube is prevented due to the resin layers.

Additionally, the outer layer is removed and the metal layer is exposed at an end portion of the electromagnetic shielding tube in which the inner and outer layers are resin layers and the intermediate layer is a metal layer. A flexible conductor such as braided wire or the like is arranged on and connected to the exposed metal layer. The flexible conductor is arranged on the outer periphery of the metal layer and, in this state, is tightened from the outer periphery by a ring member. As a result, conduction can be achieved between the metal layer and the flexible conductor, and the flexible conductor can be connected to the metal layer.

When using an electromagnetic shielding tube in, for example, an automobile or the like, the electromagnetic shielding tube is installed in an environment that is subject to large changes in temperature. Accordingly, the inner layer, the metal layer, and the outer layer may contract or expand due to changes in temperature.

If the inner layer and the metal layer contract, the metal layer will deform in a direction in which the diameter thereof decreases. Particularly, deformation in the diameter reduction direction of the inner layer may progress even after the thermal cycle due to creeping of the inner layer. As such, even in cases where the diameter reduction amount of the metal layer alone due to thermal contraction is small, the metal layer will be pulled toward the center and deformation in the diameter reduction direction will increase due to the contraction of the inner layer, which has a coefficient of thermal expansion (coefficient of linear expansion) greater than that of the metal layer. Additionally, even if the inner layer and/or the metal layer has not deformed, the push back force of the metal layer against the ring member decreases due to changes in stress in the inner layer. Thus, due to the contraction of the inner layer, contact between the metal layer and the flexible conductor connected to the outer periphery of the metal layer may worsen and contact resistance at the connection portion may increase.

Furthermore, the flexible conductor connected to the outer periphery of the metal layer may fall off due to reductions in the diameter of the metal layer. Additionally, when the inner layer of the composite tube contracts due to changes in the temperature, the repulsive force from the metal layer generated when tightening the ring member on the metal layer weakens. As a result, the flexible conductor connected to the outer periphery of the metal layer may fall off.

Thus, when the electromagnetic shielding tube is installed in an environment that is subject to significant changes in temperature, the exposed portion of the metal layer may be affected by differences in the physical properties of the inner layer and the metal layer (e.g. the difference in the coefficients of thermal expansion described above, and the like), and the contact resistance between the metal layer and the flexible conductor may increase.

SUMMARY OF THE DISCLOSURE

In light of the problems described above, an object of the present embodiments is to provide an electromagnetic shielding tube and the like whereby differences in the physical properties of the inner layer and the metal layer can be suppressed.

A first aspect that achieves the object described above is an electromagnetic shielding tube through which an electric wire can be inserted. The electromagnetic shielding tube includes an inner layer made of resin; a metal layer formed on an outer periphery of the inner layer; and an outer layer made of resin, formed on an outer periphery of the metal layer. In this aspect, the metal layer is exposed at an end portion or an end portion vicinity of the electromagnetic shielding tube; and a terminal processed portion that mitigates effects caused by differences in physical properties of the inner layer and the metal layer is provided on an exposed portion of the metal layer.

The terminal processed portion may be a stress transmission suppressing structure that, in at least a portion of the inner layer, suppresses radial forces of the inner layer generated due to changes in temperature from being transmitted to the metal layer.

The stress transmission suppressing structure may be a separated portion formed in the inner layer; and in a cross-section perpendicular to a length direction of the electromagnetic shielding tube, the inner layer may be divided into a plurality of sections in the circumferential direction by the separated portion.

The stress transmission suppressing structure may be a separated portion between the inner layer and the metal layer; and at an inner surface of at least a portion of the exposed portion of the metal layer, an outer surface of the inner layer and an inner surface of the metal layer may be separated from each other.

The terminal processed portion may be an uneven shape formed on an outer surface of at least a portion of the exposed portion of the metal layer.

Raised portions of the uneven shape may be positioned higher than an unprocessed surface of the metal layer.

The metal layer may be exposed in an annular shape at the end portion vicinity of the electromagnetic shielding tube; and the terminal processed portion may be a retaining portion that prevents a conductor, which is provided on an outer peripheral surface of the metal layer on a tip side of the exposed portion of the metal layer and is connected to the metal layer, from falling off.

The retaining portion may be a portion of the outer layer.

The retaining portion may be a tube fixed on the tip side of the exposed portion of the metal layer.

The retaining portion may be resin disposed on the tip side of the exposed portion of the metal layer.

According to the first aspect, the terminal processed portion that mitigates the effects caused by differences in physical properties of the inner layer and the metal layer is provided on the exposed portion of the metal layer. As such, for example, increases in contact resistance between the metal layer and the flexible conductor attached to the outer periphery of the metal layer can be suppressed.

The stress transmission suppressing structure is provided which, in at least a portion of the inner layer, suppresses radial forces of the inner layer generated due to changes in temperature from being transmitted to the metal layer. As such, even when the diameter of the inner layer is reduced due to changes in temperature, the diameter reduction amount of the metal layer can be kept to a minimum. As such, increases in contact resistance between the metal layer and the flexible conductor attached to the outer periphery of the metal layer can be suppressed.

In a cross-section perpendicular to a length direction of the electromagnetic shielding tube, the inner layer is divided in the circumferential direction by the separated portion formed in the inner layer as the stress transmission suppressing structure. As a result, radial forces are suppressed when the inner layer deforms.

Due to the separated portion being provided between the inner layer and the metal layer as the stress transmission suppressing structure, the outer surface of the inner layer and the inner surface of the metal layer do not join. As such, even if the inner layer deforms, the effect of this deformation on the metal layer will be small and the amount of deformation of the metal layer can be kept to a minimum.

Due to the uneven shape being formed on the outer surface of at least a portion of the exposed portion of the metal layer, the contact surface area between the metal layer and the flexible conductor increases and a predetermined contact surface area or greater can be ensured even if the metal layer somewhat contracts. As such, increases in contact resistance between the metal layer and the flexible conductor can be suppressed.

For example, due to the raised portions being provided as the uneven shape at a position higher than the surface of the unprocessed portion of the metal layer, fall-off resistance of the flexible conductor increases even more. As a result, the flexible conductor can be prevented from falling off of the metal layer due to vibrations and similar external forces.

The flexible conductor, which is joined to the exposed portion of the metal layer, can be prevented from falling off if the retaining portion is formed on the tip of the exposed portion of the metal layer. Thus, the flexible conductor can be prevented from falling off without increasing the tightening force of the ring member.

For example, if the retaining portion is a portion of the outer layer, a retaining protrusion can be formed by simply leaving a portion of the outer layer on the tip portion of the electromagnetic shielding tube when peeling the outer layer to expose the metal layer.

The retaining portion may be formed from a heat-shrinking tube or similar tube after peeling the outer layer to expose the metal layer. In this case, the outer diameter of the tip portion of the electromagnetic shielding tube is increased by the tube and, as such, the flexible conductor can be prevented from falling off.

The retaining portion may be formed by disposing resin after peeling the outer layer to expose the metal layer. In this case, the outer diameter of the tip portion of the electromagnetic shielding tube is increased by the resin and, as such, the flexible conductor can be prevented from falling off.

A second aspect is an electromagnetic shielding structure that includes an electromagnetic shielding tube through which an electric wire can be inserted; a flexible conductor attached to the electromagnetic shielding tube; and a ring member holding the flexible conductor. In this aspect, the electromagnetic shielding tube includes an inner layer made of resin; a metal layer formed on an outer periphery of the inner layer; and an outer layer made of resin, formed on an outer periphery of the metal layer. Moreover, the metal layer is exposed at an end portion of the electromagnetic shielding tube; a terminal processed portion that mitigates effects caused by differences in physical properties of the inner layer and the metal layer is provided on an exposed portion of the metal layer; the flexible conductor is arranged on the exposed portion of the metal layer; and the flexible conductor is secured to the electromagnetic shielding tube from an outer periphery of the flexible conductor by the ring member.

The terminal processed portion may be a stress transmission suppressing structure that, in at least a portion of the inner layer, suppresses radial forces of the inner layer generated due to changes in temperature from being transmitted to the metal layer.

The stress transmission suppressing structure may be a separated portion formed in the inner layer; and in a cross-section perpendicular to a length direction of the electromagnetic shielding tube, the inner layer may be divided into a plurality of sections in the circumferential direction by the separated portion.

The stress transmission suppressing structure may be a separated portion between the inner layer and the metal layer; and at an inner surface of at least a portion of the exposed portion of the metal layer, an outer surface of the inner layer and an inner surface of the metal layer may be separated from each other.

The terminal processed portion may be an uneven shape formed on an outer surface of at least a portion of the exposed portion of the metal layer; and the flexible conductor may be arranged on an outer peripheral surface of the uneven shape.

Raised portions of the uneven shape may be positioned higher than an unprocessed surface of the metal layer.

The metal layer may be exposed in an annular shape at the end portion vicinity of the electromagnetic shielding tube; and the terminal processed portion may be a retaining portion that prevents a conductor, which is provided on an outer peripheral surface of the metal layer on a tip side of the exposed portion of the metal layer and is connected to the metal layer, from falling off.

The retaining portion may be a portion of the outer layer.

The retaining portion may be a tube fixed on the tip side of the exposed portion of the metal layer.

The retaining portion may be resin disposed on the tip side of the exposed portion of the metal layer.

According to the second aspect, the terminal processed portion that mitigates the effects caused by differences in physical properties of the inner layer and the metal layer is provided on the exposed portion of the metal layer. As such, for example, increases in contact resistance between the metal layer and the flexible conductor attached to the outer periphery of the metal layer can be suppressed.

According to the present embodiments, an electromagnetic shielding tube and the like can be provided whereby effects caused by differences in the physical properties the inner layer and the metal layer can be suppressed.

BRIEF DESCRIPTION OF DRAWINGS

FIG. 4 is a cross-sectional view of an electromagnetic shielding tube 3a.

FIG. 6 is a drawing illustrating an electromagnetic shielding structure 1a.

DETAILED DESCRIPTION

Electromagnetic Shielding Tube 3

Figure 1A:
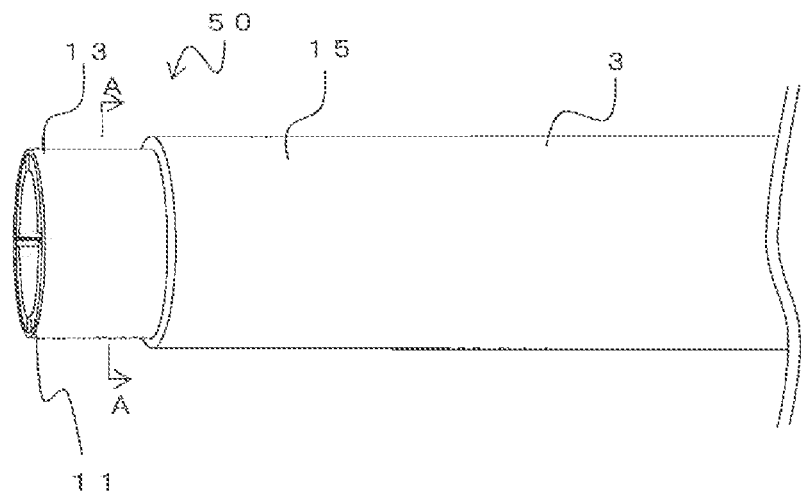
FIG. 1A is a perspective view illustrating an electromagnetic shielding tube 3.
Figure 1B:
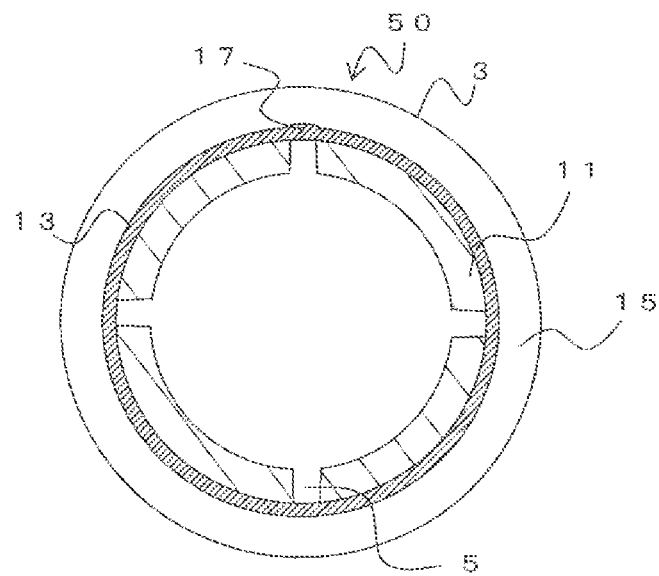
FIG. 1B is a cross-sectional view taken along line A-A of FIG. 1A.

An electromagnetic shielding tube 3 according to an embodiment is described below. FIG. 1A is a perspective view of the electromagnetic shielding tube 3; FIG. 1B is a cross-sectional view perpendicular to a length direction of the electromagnetic shielding tube 3, and is a cross-sectional view taken along line A-A of FIG. 1A. An electric wire is inserted through the electromagnetic shielding tube 3. In the electromagnetic shielding tube 3, an inner layer 11 made of resin is formed as an innermost layer, a metal layer 13 made of metal is formed on an outer periphery of the inner layer 11, and an outer layer 15 made of resin is formed on an outer periphery of the metal layer as an outermost layer.

The metal layer 13 is exposed exactly a predetermined length from an end portion of the electromagnetic shielding tube 3. A flexible conductor is connected to the exposed metal layer 13. The shielding structure in which the flexible conductor is connected to the metal layer 13 is described later.

A terminal processed portion 50, namely a separated portion 5 that is a groove-like notched portion, is provided in the inner layer 11. The separated portion 5 is formed along the length direction of the electromagnetic shielding tube 3. Additionally, a depth of the separated portion 5 is the same value as the thickness of the inner layer 11. As such, the inner surface of the metal layer 13 is exposed at the separated portion 5. It is preferable that the separated portion 5 be formed at a plurality of locations in the circumferential direction. In a cross-section perpendicular to a length direction of the electromagnetic shielding tube 3, the inner layer 11 is divided into a plurality of sections in the circumferential direction by the separated portion 5.

Note that it is preferable that the separated portion 5 is formed such that a length thereof extends from the end portion of the electromagnetic shielding tube 3 to at least a location where a ring member (described later) is disposed. For example, it is preferable that the length of the separated portion 5 from the end portion of the electromagnetic shielding tube 3 is substantially the same as an exposed length of the metal layer 13. Additionally, it is preferable that a width of the separated portion 5 is narrower than an outer diameter of the narrowest electric wire among the electric wires housed in the electromagnetic shielding tube 3. With such a configuration, the electric wires can be prevented from becoming caught in the separated portion 5.

The inner layer 11 and the outer layer 15 may be formed from the same resin, or may be formed from different resins. Examples of resins that may be selected include polyolefin resins such as polypropylene, polyethylene, and the like, and thermoplastic resins such as polyamide, polybutylene terephthalate, and the like. Note that the resin may be crosslinked or modified. For example, the resin may be crosslinked to enhance heat resistance, or may be modified with maleic acid to enhance adhesive properties. Moreover, halogen-based, phosphorus-based, metal hydrate and similar flame retardants may be added, or titanium oxide or the like may be added to enhance weather resistance.

Note that a configuration is possible in which these flame retardants and additives and the like for enhancing weather resistance are added only to the resin from which the outer layer 15 is formed. That is, the additives and the like need not be added to the resin of the inner layer 11 when flame retardancy and weather resistance are not necessary for the inner layer 11.

Provided that shielding effects can be obtained, copper, iron, or the like may be used for the metal layer 13 but, from the perspective of reducing weight and obtaining bendability, aluminum (including aluminum alloy) is preferable.

The thickness of the inner layer 11 and/or the outer layer 15 is configured to be greater than the thickness of the metal layer 13. For example, as illustrated in the drawings, the thickness of both the inner layer 11 and the outer layer 15 can be configured to be greater than the thickness of the metal layer 13. With such a configuration, flattening of the electromagnetic shielding tube 3 can be prevented, particularly when bending. Specifically, by sufficiently increasing the thickness of the inner layer 11, inward flattening of the metal layer 13 can be prevented and, by sufficiently increasing the thickness of the outer layer 15, outward flattening of the metal layer 13 can be prevented. For example, flattening of the metal layer 13 can be prevented when the metal layer 13 is bent even if the outer periphery of the bent portion of the metal layer 13 tries to collapse and flatten because the outer layer 15 imparts, to the metal layer 13, effects to return the shape to the pre-bending circular shape.

Note that the thickness of the metal layer 13 is configured such that the necessary shielding properties can be obtained. Furthermore, the thickness of the metal layer 13 is configured such that, when the electromagnetic shielding tube 3 formed from the inner layer 11 and the outer layer 15 is bent, the rigidity of the metal layer 13 in this bent state is greater than the restoring force acting to return the inner layer 11 and the outer layer 15 to their original state. That is, when the electromagnetic shielding tube 3 is bent, the internal metal layer 13 plastically deforms, and the inner layer 11 and the outer layer 15 elastically deform via their own flexibility. In contrast, if the rigidity of the metal layer 13 in the bent state is configured to be greater than the restoring force generated by the elastic deformation of the inner layer 11 and the outer layer 15, the shape of the electromagnetic shielding tube 3 in the bent state can be maintained.

Note that, it is preferable that the stress generated due to the difference in linear expansion coefficients and the like of the inner layer 11 and the outer layer 15 and the metal layer 13 be considered when configuring the thickness of the metal layer 13. That is, the linear expansion coefficients of the inner layer 11 and the outer layer 15, which are made of resin, and the metal layer 13, which is made of metal, are different. As such, stress is applied to the intermediate metal layer 13 in accordance with changes in temperature. Here, if the stress is within the elastic deformation region (e.g. 0.2% proof strength or less for aluminum), breakage caused by repeated elastic deformation can be prevented.

The stress generated in the metal layer 13 varies depending on the difference between the linear expansion coefficients of the metal layer 13 and the inner layer 11 and the outer layer 15, the use environment, the thicknesses of each layer, and other factors. In a normal state of use in an electric automobile, if the metal layer 13 has a thickness of 0.15 mm or greater, stress exceeding the proof strength can be prevented from being imparted by the inner layer 11 and the outer layer 15. Accordingly, it is preferable that the thickness of the metal layer 13 is 0.15 mm or greater.

It is also preferable that external damage resistance be considered when setting the thickness of the outer layer 15. In a normal state of use in an electric automobile, the outer layer 15 has the role of a protecting layer and protects the metal layer 13 from being damaged by flying rocks and the like. For the outer layer 15 to exhibit functionality as a protecting layer, it is preferable that the thickness thereof is 0.5 mm or greater. This is because that, when less than 0.5 mm, the outer layer 15 may be damaged by flying rocks and the like and the metal layer 13, located under the outer layer 15, may also be damaged.

Next, a method for manufacturing the electromagnetic shielding tube 3 will be described. First, a resin tube that becomes the inner layer 11 is extruded using an inner layer extruder. The resin tube that becomes the inner layer 11 contracts during post-extrusion cooling and, as such, is sized using a vacuum sizing machine. The vacuum sizing machine exhausts air from the outer surface side while the resin tube is sandwiched in the mold and, as a result, the resin tube is pressed against the inner peripheral surface of the mold and contraction of the outer diameter is suppressed. Then, as necessary, an adhesive may be coated on the outer periphery of the resin tube using an adhesive coating device.

Next, the resin tube is passed through an outer diameter measuring instrument and the outer diameter of the resin tube is measured. The outer diameter measuring instrument is, for example, a laser measuring instrument. In cases where the outer diameter of the resin tube is found to be within a predetermined range by the outer diameter measuring instrument, manufacturing is continued. On the other hand, in cases where the outer diameter of the resin tube is found to be outside the predetermined range by the outer diameter measuring instrument, the mold size or the like of the vacuum sizing machine is adjusted.

Next, a metal thin plate (including a metal sheet), which is a belt-like member that forms the metal layer 13, is supplied from a belt-like member supply unit. This belt-like member is subjected to forming processing by a forming machine, and is fed around the outer periphery of the inner layer 11 resin tube such that the edge portions of the belt-like member abut against each other, thus forming a cylindrical shape. Furthermore, the abutting portion of the belt-like member is welded using a welding machine. Thus, the metal layer 13 is formed on the outer periphery of the inner layer 11 resin tube.

Furthermore, the outer periphery of the metal layer 13 is covered with an outer layer resin that is extruded using an outer layer extruder. Additionally, as necessary, the outer layer 15 is crosslinked. Note that the outer layer 15 may be crosslinked using UV light or heat. Here, the inner layer 11 may also be crosslinked at the same time, or only the outer layer 15 may be crosslinked. With such a configuration, it is possible to crosslink only the outer layer 15 and leave the inner layer 11 non-crosslinked. By crosslinking the outer layer 15, adhesion between the outer layer 15 and the metal layer 13 can be enhanced. As such, peelability of the outer layer 15 from the metal layer 13 can be ensured.

By using the manufacturing method described above, a joining portion 17 is formed in a portion of the metal layer 13, as illustrated in FIG. 1B. Accordingly, in the cross-section illustrated in the FIG. 1B, there are no gaps formed in the metal layer 13 that constitutes the shielding layer.

Note that, the joining portion 17 may be lap welded instead of being butt welded. However, by butt welding, there will be no overlapping portion of the belt-like member and, as a result, there will be little variation in the thickness in the circumferential direction of the metal layer 13. Significant variations in the thickness of the metal layer 13 are more likely to become starting points of buckling when bending the electromagnetic shielding tube 3. As such, buckling can be prevented from occurring by butt welding.

An adhesive may be provided between the inner layer 11 and the metal layer 13, and/or between the metal layer 13 and the outer layer 15, respectively. In the disclosed embodiments, "the metal layer being formed on the outer periphery of the inner layer" is not necessarily limited configurations in which the inner layer 11 and the metal layer 13 are in direct contact with each other, and includes configurations in which other layers are formed between the inner layer 11 and the metal layer 13.

Likewise, "the outer layer made of resin being formed on the outer periphery of the metal layer" is not necessarily limited configurations in which the outer layer 15 and the metal layer 13 are in direct contact with each other, and includes configurations in which other layers are formed between the outer layer 15 and the metal layer 13.

Here, it is preferable that the bonding strength between the outer layer 15 and the metal layer 13 is weaker than the bonding strength between the inner layer 11 and the metal layer 13. For example, an adhesive layer may be provided between the inner layer 11 and the metal layer 13, and the outer layer 15 may be extruded and applied directly on the metal layer 13, without providing an adhesive layer or the like therebetween. The effects of the strain caused by the difference in the linear expansion coefficient with the metal layer 13 are significant for the inner layer 11. As such, from the perspective of maintaining the joined state of the metal layer 13 to the inner layer 11, it is preferable that the adhesive layer be provided. However, the effects of the strain for the outer layer 15 are less compared to the inner layer 11 and, as such, the adhesive layer need not necessarily be provided between the metal layer 13 and the outer layer 15. With such a configuration, it is possible to easily peel only the outer layer 15 and, when peeling the outer layer 15, it is possible to prevent the metal layer 13 from being peeled along with the outer layer 15 and becoming broken. Accordingly, it is possible to easily peel the outer layer 15 at the end portion of the electromagnetic shielding tube 3.

Note that the surface roughness of the surface of the metal layer 13 facing the inner layer 11 may be made rougher than the surface roughness of the surface of the metal layer 13 facing the outer layer 15 in order to make the bonding strength between the outer layer 15 and the metal layer 13 weaker than the joining strength between the inner layer 11 and the metal layer 13. Additionally, a resin with greater adhesiveness with respect to the metal layer 13 than the resin of the outer layer 15 may be selected as the resin of the inner layer 11.

The tube body obtained in this manner is cut to a predetermined length. Additionally, the outer layer 15 at the end portion vicinity of the tube body is removed and the separated portion 5 is formed in a portion of the inner layer 11 from the end portion of the tube body. Thus, the electromagnetic shielding tube 3 including a connecting portion is completed.

Figure 2:
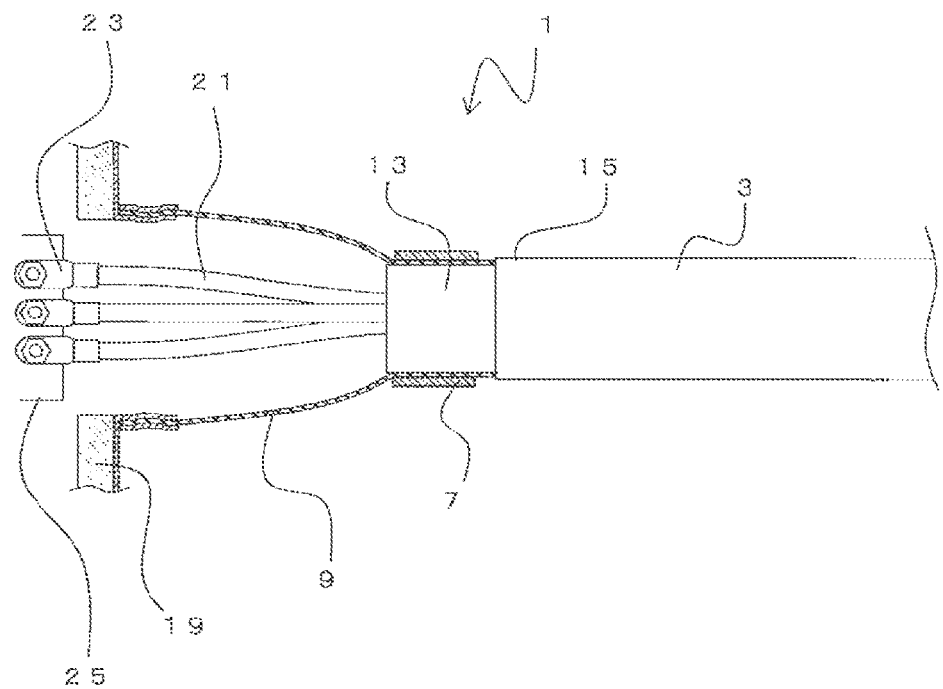
FIG. 2 is a drawing illustrating an electromagnetic shielding structure 1.

Next, an electromagnetic shielding structure 1 in which the electromagnetic shielding tube 3 of the present embodiment is used will be described. FIG. 2 is a partial cross-sectional view illustrating the electromagnetic shielding structure 1. The electromagnetic shielding structure 1 is provided with the electromagnetic shielding tube 3, a flexible conductor 9 attached to the electromagnetic shielding tube 3, a ring member 7 holding the flexible conductor 9, and the like. An electric wire 21 is inserted through the electromagnetic shielding tube 3. A terminal 23 is connected to the end portion of the electric wire 21, which is a covered wire. Note that the number of electric wires 21 is not limited to the example illustrated in the drawings.

The electric wire 21 is pulled through the end portion of the electromagnetic shielding tube 3. A terminal 23 of the electric wire 21 is connected to a connection target, namely a connected device 25. Note that the connected device 25 is, for example, an inverter or the like and is disposed in the interior of a housing 19. The housing 19 is made of steel, for example, and has shielding properties.

A first end portion of the flexible conductor 9 is arranged on the outer periphery of the exposed portion of the metal layer 13 at the end portion of the electromagnetic shielding tube 3. The flexible conductor 9 is braided wire, for example, and has shielding properties.

The ring member 7 is provided on the outer periphery of the flexible conductor 9. The flexible conductor 9 is secured to the electromagnetic shielding tube 3 as a result of the flexible conductor 9 being tightened by the ring member 7 from the outer periphery of the flexible conductor 9. A second end portion of the flexible conductor 9 is connected to the housing 19. Conduction between the metal layer 13 and the housing 19 is realized by the flexible conductor 9.

As described above, the electromagnetic shielding structure 1 is used in electric automobiles and the like, for example. As such, changes in environmental temperatures are significant, and the inner layer 11, the metal layer 13, and the outer layer 15 of the electromagnetic shielding tube 3 may contract or expand.

Here, the separated portion 5 is formed in the inner layer 11, and the inner layer 11 is divided in the circumferential direction by the separated portion 5. As such, even if the inner layer 11 contracts due to creeping or the like, contraction in the diameter reduction direction of the inner layer 11 can be suppressed. As a result, reductions of the diameter, greater than or equal to the thermal contraction of the metal layer 13 alone and caused by the metal layer 13 being pulled by the inner layer 11, can be suppressed. As a result, increases in contact resistance between the metal layer 13 and the flexible conductor 9 resulting from contraction of the metal layer 13 can be suppressed.

Figure 3A:
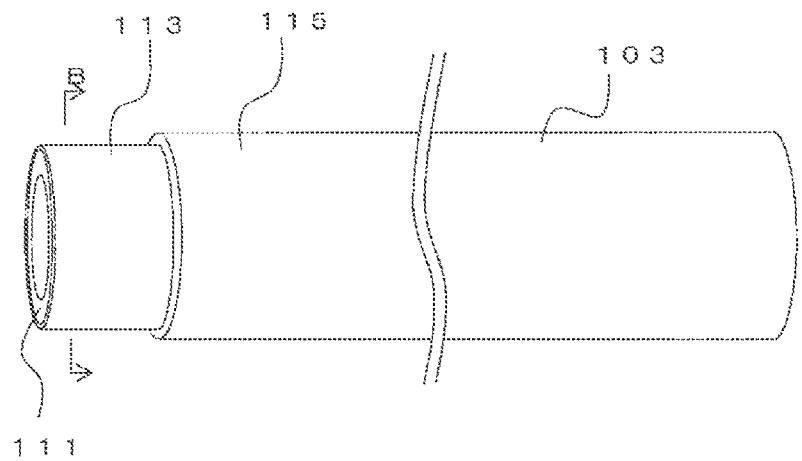
FIG. 3A illustrates a conventional example and is a perspective view illustrating an electromagnetic shielding tube 103.
Figure 3B:
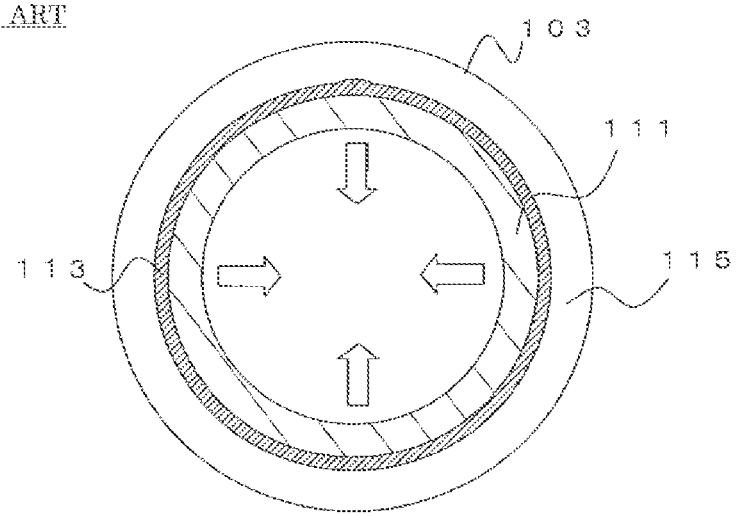
FIG. 3B illustrates a conventional example and is a cross-sectional view taken along line B-B of FIG. 3A.

In contrast, with a conventional electromagnetic shielding tube, the contact resistance between the metal layer and the flexible conductor may increase due to the effects caused by differences in the physical properties of the inner layer and the metal layer. FIG. 3A is a perspective view illustrating a conventional electromagnetic shielding tube 103; and FIG. 3B is a cross-sectional view taken along line B-B of FIG. 3A. In the electromagnetic shielding tube 103, an inner layer 111 made of resin is formed as an innermost layer, an outer layer 115 made of resin is formed as an outermost layer, and a metal layer 113 made from metal is formed between the inner layer 111 and the outer layer 115.

As with the electromagnetic shielding tube 3, the outer layer 115 is removed from the end portion of the electromagnetic shielding tube 103 and the metal layer 113 is exposed. A flexible conductor such as braided wire or the like is arranged on and connected to the exposed metal layer 113. For example, the flexible conductor is arranged on the outer periphery of the metal layer 113 and, in this state, is tightened from the outer periphery by a ring member. As a result, the flexible conductor can be connected to the metal layer 113 and conduction can be realized between the metal layer 113 and the flexible conductor.

In cases where using the electromagnetic shielding tube 103 in an automobile or the like, for example, the exposed portion of the metal layer 113 may be affected by differences in the physical properties of the inner layer 111 and the metal layer 113. For example, if the electromagnetic shielding tube 103 is installed in an environment that is subject to significant changes in temperature, the inner layer 111, the metal layer 113, and the outer layer 115 will contract or expand in accordance with the changes in temperature. In this case, the amount of thermal contraction or the amount of thermal expansion of the inner layer 111 and the outer layer 115 will be greater than that of the metal layer 113.

As illustrated in FIG. 3B, in a low temperature environment, the inner layer 111 deforms in a direction in which the diameter thereof decreases. Here, the inner layer 111 is bonded to the metal layer 113 and, as such, radial forces are imparted to the metal layer 113 from the inner layer 111. Particularly, deformation in the radial direction of the inner layer 111 may progress after the thermal cycle due to creeping of the inner layer 111. As such, even when the amount of deformation due to heat of the metal layer 13 alone is small, the metal layer 13 is subjected to the radial forces generated by the deformation of the inner layer 111, which leads to increased deformation in the radial direction. Additionally, even if the inner layer 111 and/or the metal layer 113 has not deformed, the push back force of the metal layer 113 against the ring member decreases due to changes in stress in the inner layer 111.

Accordingly, contact resistance between the metal layer 113 and the flexible conductor may increase due to the contraction of the inner layer 111. In contrast, according to the electromagnetic shielding tube 3 of the present embodiment, the terminal processed portion 50, namely the separated portion 5, which mitigates the effects caused by the differences in the physical properties of the inner layer 11 and the metal layer 13, is provided on the exposed portion of the metal layer 13. As such, increases in contact resistance between the metal layer 13 and the flexible conductor 9 resulting from contraction of the metal layer 13 can be suppressed.

According to the present embodiment, the inner layer 11 is divided in the circumferential direction and, as such, deformation in the diameter reduction direction can be suppressed when the inner layer 11 contracts. As such, deformation in the diameter reduction direction of the metal layer 13, and decreases in the repulsive force of the metal layer 13 against the ring member 7 that is generated when tightening the ring member 7 can be suppressed. As a result, increases in contact resistance between the metal layer 13 and the flexible conductor 9 resulting from contraction or decreases in the repulsive force of the metal layer 13 can be suppressed.

Furthermore, the ring member 7 does not loosen and the flexible conductor 9 does not fall off of the electromagnetic shielding tube 3. That is, the terminal processed portion 50, namely the separated portion 5, functions as a stress transmission suppressing structure that, in at least a portion of the inner layer 11, suppresses diameter reduction direction forces of the inner layer 11 generated due to changes in temperature from being transmitted to the metal layer 13.

Note that in the electromagnetic shielding structure 1 described above, an example is illustrated in which one flexible conductor 9 is used and arranged on the electromagnetic shielding tube 3 (the metal layer 13), but the present embodiment is not limited thereto. For example, in cases where the electric wire 21 branches into multiple electric wires 21, flexible conductors 9 that cover each of the electric wires 21 up to the connection target may be used, and the plurality of flexible conductors 9 may be stacked and secured collectively by the ring member 7.

Electromagnetic Shielding Tube 3a

Figure 4:
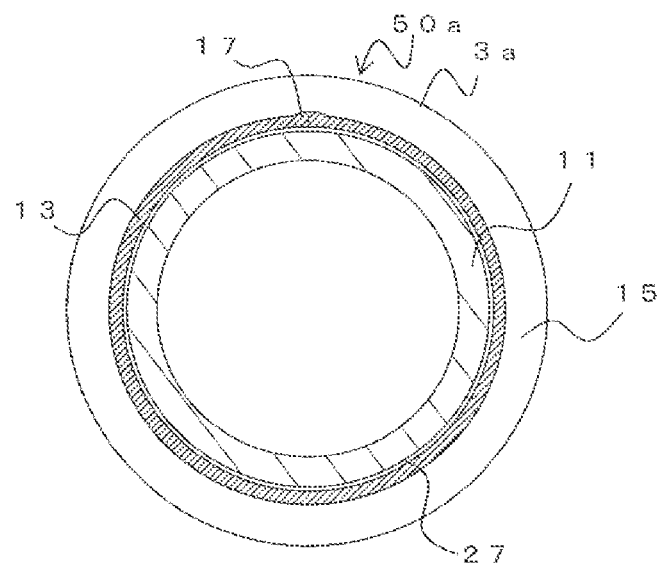

Next, a second embodiment will be described. FIG. 4 is a cross-sectional view illustrating an electromagnetic shielding tube 3a. Note that, in the description below, constituent elements which serve the same functions as in the configuration illustrated in FIGS. 1A, 1B, and 2 are assigned the same reference numerals as in FIGS. 1A, 1B, and 2, and redundant descriptions of those constituent elements are foregone.

The electromagnetic shielding tube 3a is substantially the same as the electromagnetic shielding tube 3, with the exception of the terminal processed portion (the stress transmission suppressing structure). In the electromagnetic shielding tube 3a, a terminal processed portion 50a, namely a separated portion 27, is provided between the inner layer 11 and the metal layer 13. The separated portion 27 is a portion where the outer surface of the inner layer 11 and the inner surface of the metal layer 13 are separated and are not joined to each other.

Note that it is preferable that the separated portion 27 is formed such that a length thereof extends from the end portion of the electromagnetic shielding tube 3a to at least a location where a ring member (described later) is disposed.

For example, it is preferable that the length of the separated portion 27 from the end portion of the electromagnetic shielding tube 3a is substantially the same as an exposed length of the metal layer 13.

As described above, the inner layer 11 and the metal layer 13 are bonded to each other by an adhesive or the like. With such a configuration, flattening of the metal layer 13 to the inside when bending the electromagnetic shielding tube 3a can be prevented by the inner layer 11.

On the other hand, the inner layer 11 and the metal layer 13 are not bonded to each other at the exposed portion of the metal layer 13. As such, even if the diameter of the inner layer 11 decreases at this portion, diameter reduction direction forces of the inner layer 11 can be prevented from being transmitted to the metal layer 13. That is, the terminal processed portion 50a, namely the separated portion 27, can be made to function as a stress transmission suppressing structure that, in at least a portion of the inner layer 11, suppresses the radial forces of the inner layer 11 generated due to changes in temperature from being transmitted to the metal layer 13.

Note that, instead of using the separated portion 27, the adhesive force of the adhesive layer between the inner layer 11 and the metal layer 13 may be made weaker than the adhesive force between the outer layer 15 and the metal layer 13.

The same effects can be obtained in the second embodiment as in the first embodiment.

Electromagnetic Shielding Tube 3b

Figure 5A:
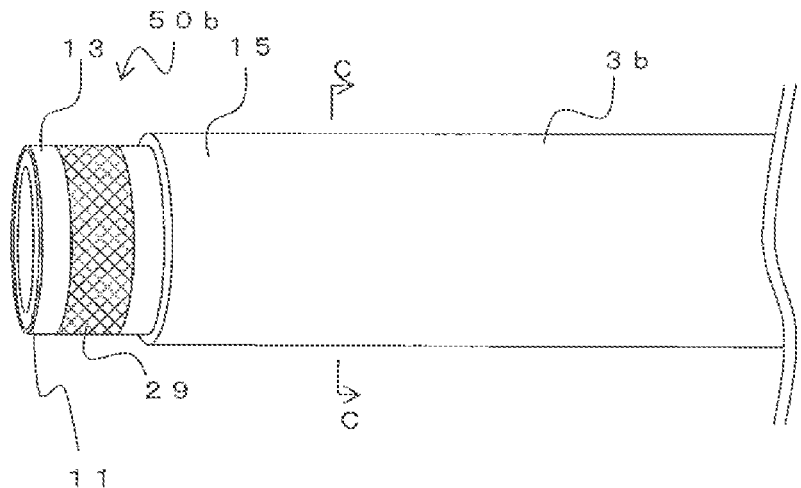
FIG. 5A is a perspective view illustrating an electromagnetic shielding tube 3b.
Figure 5B:
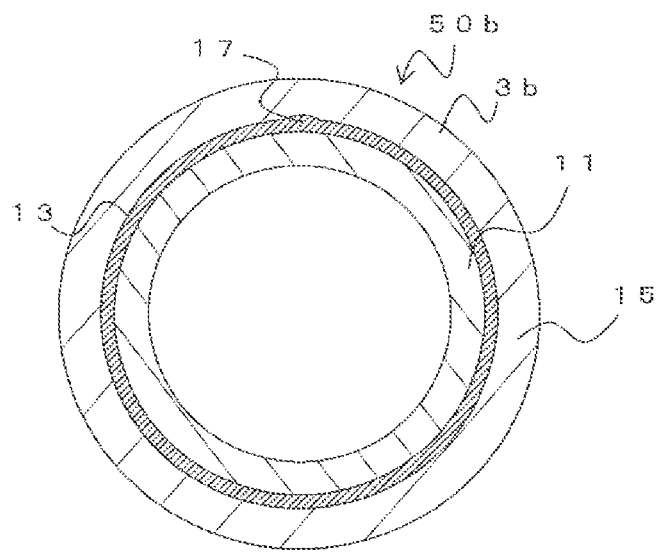
FIG. 5B is a cross-sectional view taken along line C-C of FIG. 5A.

Next, a third embodiment will be described. FIG. 5A is a perspective view of an electromagnetic shielding tube 3b; FIG. 5B is a cross-sectional view perpendicular to a length direction of the electromagnetic shielding tube 3b, and is a cross-sectional view taken along line C-C of FIG. 5A.

As described above, the outer layer 15 is peeled exactly a predetermined length from the end portion of the electromagnetic shielding tube 3b. That is, the metal layer 13 is exposed exactly a predetermined range at the end portion of the electromagnetic shielding tube 3b. A terminal processed portion 50b, namely an uneven portion 29, is formed on at least a portion of the exposed portion of the metal layer 13. The uneven portion 29 is a fine uneven shape formed on the outer peripheral surface of the metal layer 13, and is formed on the entire periphery in the circumferential direction of the metal layer 13. Note that it is preferable that raised portions of the uneven portion 29 are positioned higher than the surface of the unprocessed portion (portions other than the uneven portion 29) of the metal layer. A flexible conductor is connected to the exposed metal layer 13. Note that, the shielding structure to which the flexible conductor is connected is described later.

The uneven portion 29 may, for example, be formed in a range corresponding to the location where the ring member 7 is disposed, or may be formed throughout the entire surface of the exposed portion.

As with the electromagnetic shielding tube 3, with the electromagnetic shielding tube 3b, the tube body is cut to a predetermined length, and the outer layer 15 at the end portion vicinity thereof is removed. Then, the uneven portion 29 is formed on the outer peripheral surface of the exposed metal layer 13. Thus, the electromagnetic shielding tube 3b having a connecting portion is completed. While any form is acceptable for the uneven portion 29, knurling by pressing and embossing are preferable as processing techniques for forming the raised portions of the uneven portion 29 at positions higher than the surface of the unprocessed portion of the metal layer 13. Additionally, techniques for forming the uneven portion 29 such as knurling and grooving by cutting, burning out by lasering, and the like may be used.

Figure 6:
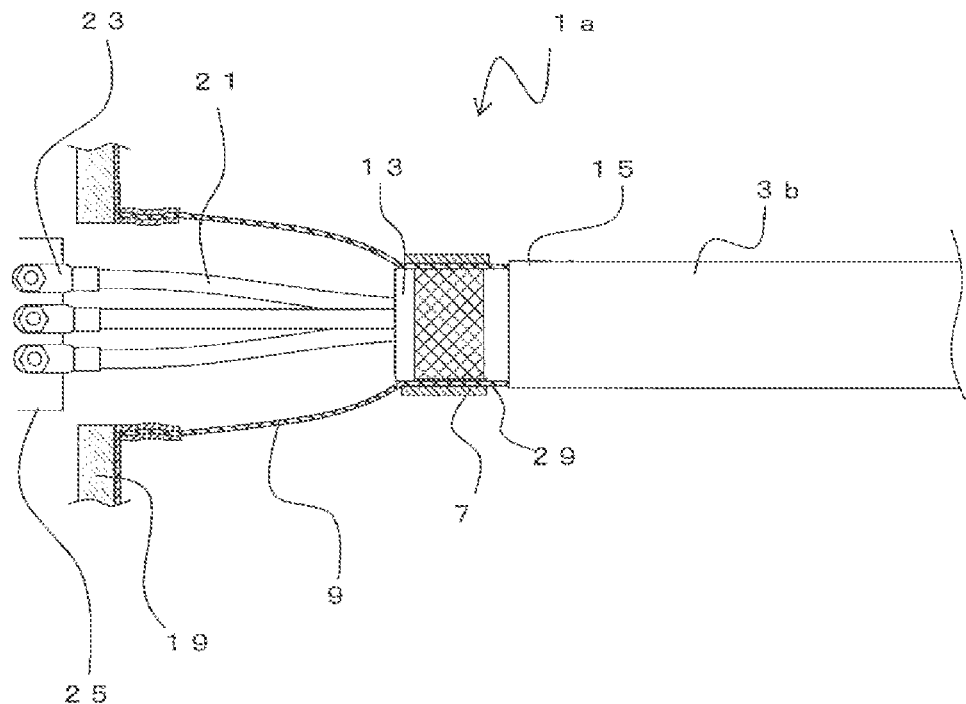

Next, an electromagnetic shielding structure 1a in which the electromagnetic shielding tube 3a is used will be described. FIG. 6 is a partial cross-sectional view illustrating the electromagnetic shielding structure 1a. An electric wire 21 is inserted through the electromagnetic shielding tube 3b. A terminal 23 is connected to the end portion of the electric wire 21, which is a covered wire. Note that the number of electric wires 21 is not limited to the examples illustrated in the drawings.

The electric wire 21 is pulled from the end portion of the electromagnetic shielding tube 3b. A terminal 23 of the electric wire 21 is connected to a connection target, namely a connected device 25.

A first end portion of the flexible conductor 9 is arranged on the outer periphery of the exposed portion of the metal layer 13 at the end portion of the electromagnetic shielding tube 3b. That is, the flexible conductor 9 is disposed on the outer periphery of the uneven portion 29. The flexible conductor 9 is braided wire, for example, and has shielding properties.

Here, the flexible conductor 9 contacts the uneven portion 29. As such, the contact surface area between the flexible conductor 9 and the metal layer 13 increases. As a result, sufficient contact surface area between the flexible conductor 9 and the metal layer 13 can be obtained. For example, even if the inner layer 11 contracts due to creeping or the like and, as a result, the metal layer 13 slightly contracts or the repulsive force of the metal layer 13 against the ring member 7 that is generated when tightening the ring member 7 decreases, the flexible conductor 9 will not separate from the metal layer 13 due to the uneven portion 29. As such, increases in contact resistance between the metal layer 13 and the flexible conductor 9 can be suppressed.

The same effects can be obtained in the third embodiment as in the first embodiment. Additionally, the terminal processed portion 50b, namely the uneven portion 29, which mitigates the effects caused by differences in the physical properties of the inner layer 11 and the metal layer 13, is formed on the exposed portion of the metal layer 13 and, as such, the contact surface area between the metal layer 13 and the flexible conductor 9 can be increased. As such, increases in contact resistance between the metal layer 13 and the flexible conductor 9 can be suppressed.

Additionally, fall-off resistance of the flexible conductor 9 from the metal layer 13 increases due to the uneven portion 29 and, thus, the flexible conductor 9 can be prevented from falling off of the electromagnetic shielding tube 3b.

Electromagnetic Shielding Tube 3f

Figure 7A:
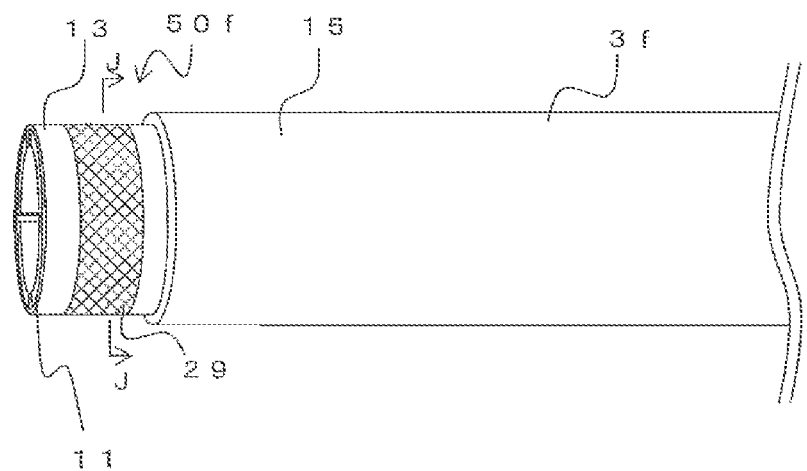
FIG. 7A is a perspective view illustrating an electromagnetic shielding tube 3f.
Figure 7B:
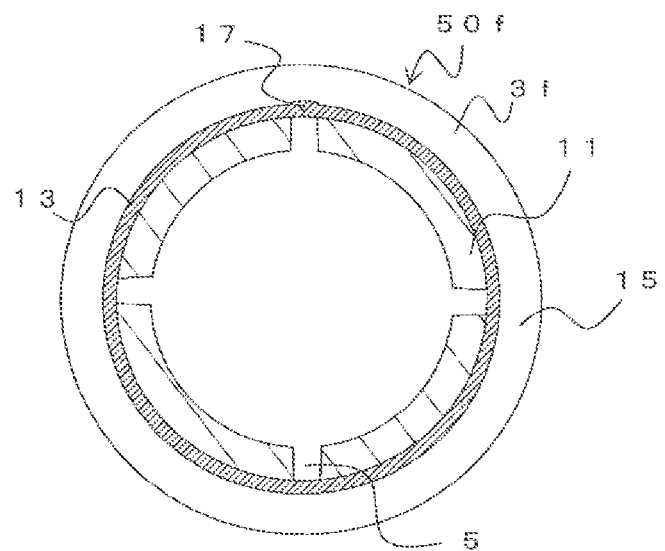
FIG. 7B is a cross-sectional view taken along line J-J of FIG. 7A.

Next, a fourth embodiment will be described. FIG. 7A is a perspective view illustrating an electromagnetic shielding tube 3f; FIG. 7B is a cross-sectional view perpendicular to a length direction of the electromagnetic shielding tube 3f, and is a cross-sectional view taken along line J-J of FIG. 7A. The electromagnetic shielding tube 3f is substantially the same as the electromagnetic shielding tube 3b, with the exception that the groove-like separated portion 5 of the electromagnetic shielding tube 3 described above is provided in the inner layer 11. The separated portion 5 is a structure for suppressing the transmission of stress caused by changes in temperature between the inner layer 11 and the metal layer 13. That is, in the electromagnetic shielding tube 3f, terminal processed portions 50f, namely the uneven portion 29 and the separated portion 5, are provided.

The same effects can be obtained in the fourth embodiment as in the third embodiment. Additionally, the terminal processed portions 50f, namely the uneven portion 29 and the separated portion 5 (stress transmission suppressing structures), which mitigate the effects caused by differences in the physical properties of the inner layer 11 and the metal layer 13, are provided on the exposed portion of the metal layer 13. As such, increases in contact resistance between the metal layer 13 and the flexible conductor 9 resulting from contraction of the metal layer 13 can be suppressed.

Note that, in order to suppress deformation in the diameter reduction direction of the metal layer 13 caused by the effects of creeping and the like of the inner layer 11, the separated portion 27 of the electromagnetic shielding tube 3a may be provided between the inner layer 11 and the metal layer 13 in the exposed range of the metal layer 13.

Electromagnetic Shielding Tube 3c

Figure 8A:
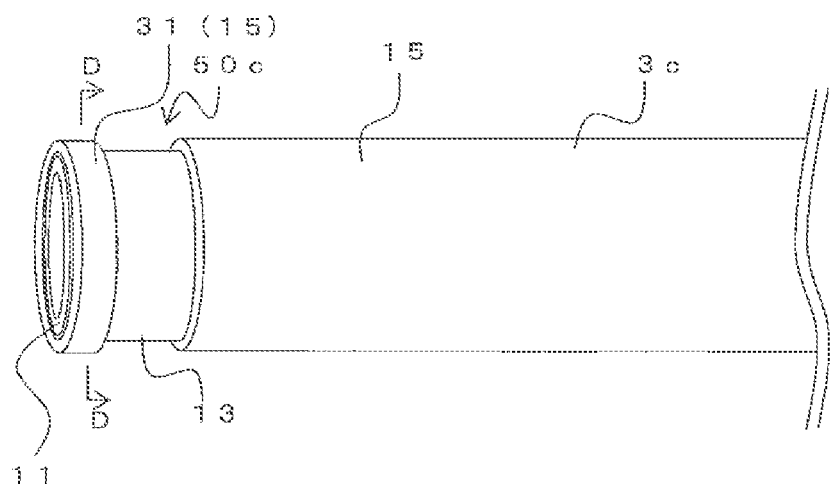
FIG. 8A is a perspective view illustrating an electromagnetic shielding tube 3c.
Figure 8B:
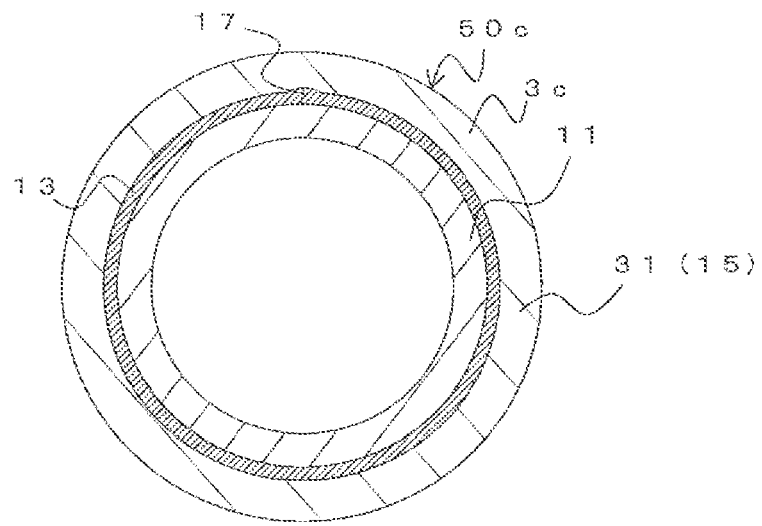
FIG. 8B is a cross-sectional view taken along line D-D of FIG. 8A.

Next, a fifth embodiment will be described. FIG. 8A is a perspective view of an electromagnetic shielding tube 3c; FIG. 8B is a cross-sectional view perpendicular to a length direction of the electromagnetic shielding tube 3c, and is a cross-sectional view taken along line D-D of FIG. 8A.

The outer layer 15 is peeled exactly a predetermined length from the end portion of the electromagnetic shielding tube 3c. That is, the metal layer 13 is exposed exactly a predetermined range at the end portion of the electromagnetic shielding tube 3c. A flexible conductor is connected to the exposed metal layer 13. The shielding structure to which the flexible conductor is connected is described later.

The terminal processed portion 50c, namely a retaining portion 31, is provided on the tip side of the exposed portion of the metal layer 13. The retaining portion 31 prevents the flexible conductor 9 that is connected to the metal layer 13 from falling off. The retaining portion 31 is joined to the metal layer 13 and is a protrusion with an outer diameter larger than that of the metal layer 13 throughout the entire periphery of the metal layer 13. In the present embodiment, a portion of the outer layer 15 is used for the retaining portion 31. Specifically, by peeling the outer layer 15 in a belt-like manner while not peeling (leaving) the outer layer 15 of the portions of the metal layer 13 other than the exposed portion, the exposed portion of the metal layer 13 will be formed in an annular shape at the end portion vicinity of the electromagnetic shielding tube 3c.

Note that it is preferable that the exposed portion of the metal layer 13 is formed with a width that is sufficient for at least the disposal of the ring member 7.

Note that, as described above, the effects of strain are less for the outer layer 15 than for the inner layer 11 and, as such, the outer layer 15 need not necessarily be adhered. In cases where the outer layer 15 is not adhered to the metal layer 13, it is preferable that the outer layer 15 and the metal layer 13 are fused to each other a degree whereby the retaining portion 31 does not easily fall off of the metal layer 13.

Figure 9:
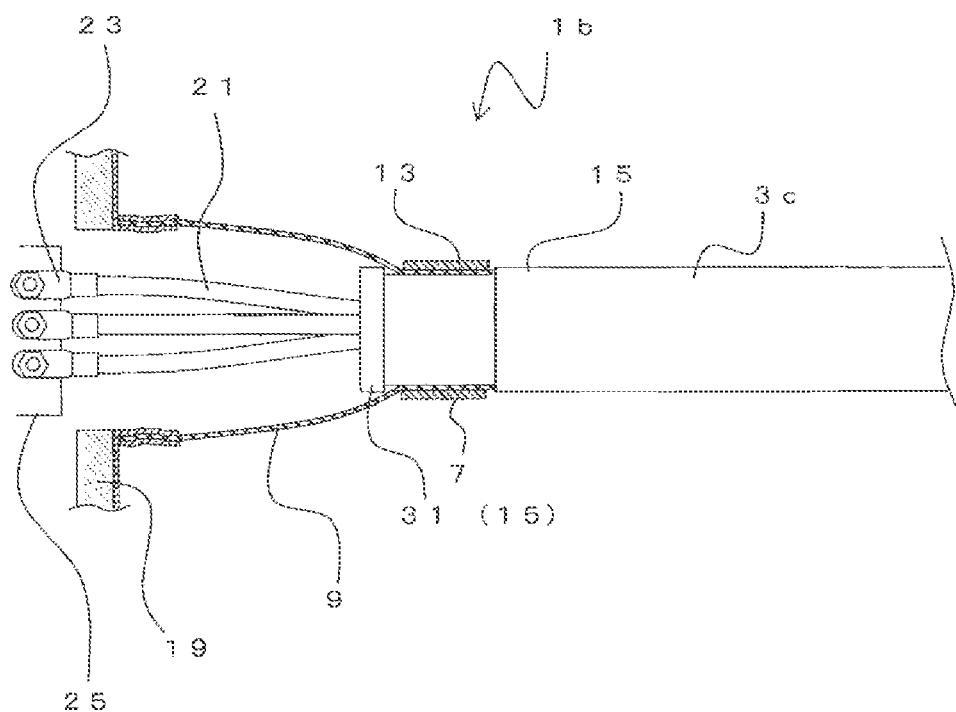
FIG. 9 is a drawing illustrating an electromagnetic shielding structure 1b.

Next, an electromagnetic shielding structure 1b in which the electromagnetic shielding tube 3c is used will be described. FIG. 9 is a partial cross-sectional view illustrating the electromagnetic shielding structure 1b. The electric wire 21 is pulled from the end portion of the electromagnetic shielding tube 3c. A terminal 23 of the electric wire 21 is connected to a connection target, namely a connected device 25.

A first end portion of the flexible conductor 9 is arranged on the outer periphery of the exposed portion of the metal layer 13 at the end portion vicinity of the electromagnetic shielding tube 3c. The flexible conductor 9 is braided wire, for example, and has shielding properties.

The flexible conductor 9 is secured to the electromagnetic shielding tube 3c by the ring member 7 being provided on the outer periphery of the flexible conductor 9 and the flexible conductor 9 being tightened by the ring member 7. A second end portion of the flexible conductor 9 is connected to the housing 19. Conduction between the metal layer 13 and the housing 19 is realized by the flexible conductor 9.

Here, if the ring member 7 is over tightened, the metal layer 13 will deform and the inner diameter will change. Accordingly, the ring member 7 cannot not be tightened too strongly. On the other hand, if the tightening of the ring member 7 is insufficient, the ring member 7 and the flexible conductor 9 may fall off of the metal layer 13 but, in the present embodiment, the retaining portion 31 is provided on the tip of the exposed portion of the metal layer 13. As such, the retaining portion 31 functions as a stopper for the ring member 7 and the flexible conductor 9 that is tightened by the ring member 7. Thus, even if the flexible conductor 9 is pulled, the flexible conductor 9 will not fall off of the end portion of the electromagnetic shielding tube 3c.

The same effects can be obtained in the fifth embodiment as in the first embodiment. Additionally, the terminal processed portion 50c, namely the retaining portion 31, which mitigates the effects caused by differences in the physical properties of the inner layer 11 and the metal layer 13, is provided on the exposed portion of the end portion of the electromagnetic shielding tube 3c. As such, even if the ring member 7 loosens, the ring member 7 and the like can be prevented from falling off of the end portion of the electromagnetic shielding tube 3c.

Electromagnetic Shielding Tube 3d

Figure 10A:
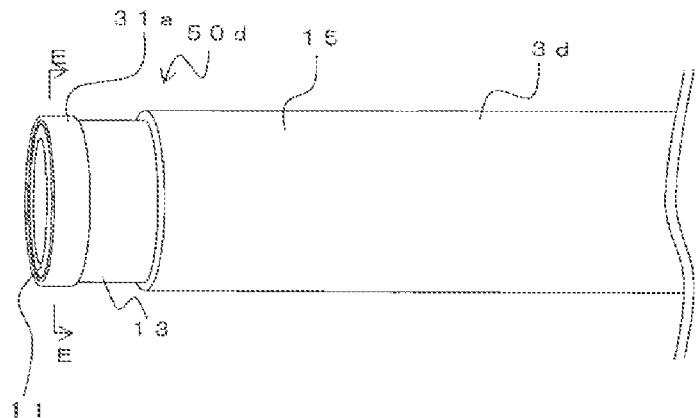
FIG. 10A is a perspective view illustrating an electromagnetic shielding tube 3d.
Figure 10B:
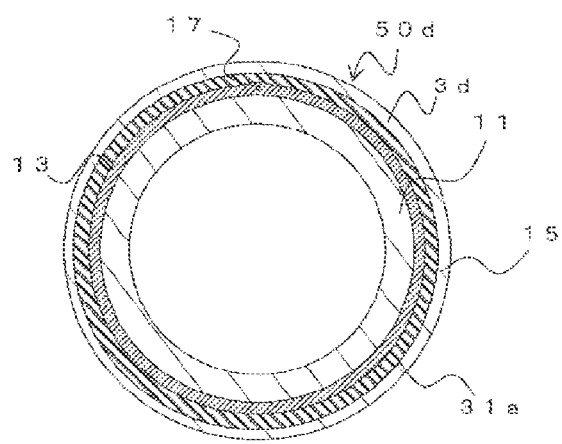
FIG. 10B is a cross-sectional view taken along line E-E of FIG. 10A.

Next, a sixth embodiment will be described. FIG. 10A is a perspective view illustrating an electromagnetic shielding tube 3d; FIG. 10B is a cross-sectional view perpendicular to a length direction of the electromagnetic shielding tube 3d, and is a cross-sectional view taken along line E-E of FIG. 10A.

The electromagnetic shielding tube 3d is substantially the same as the electromagnetic shielding tube 3c, with the exception that a retaining portion 31a is different. In the electromagnetic shielding tube 3d, a terminal processed portion 50d, namely a retaining portion 31a is formed by a separate member instead of from a portion of the outer layer 15. For example, after peeling a predetermined length of the outer layer 15 at the end portion of the electromagnetic shielding tube 3d, a heat-shrinkable tube or similar tube may be arranged on the end portion of the metal layer 13 and secured to the metal layer 13 by bonding or adhering.

Additionally, after peeling a predetermined length of the outer layer 15 at the end portion of the electromagnetic shielding tube 3d, resin may be disposed on the end portion of the metal layer 13. With such a configuration, a retaining portion 31a with an outer diameter larger than that of the metal layer 13 (or the inner diameter of the ring member 7) can be formed throughout the entire periphery of the metal layer 13. Note that the "disposal of resin" includes the application of coating materials and the like.

The same effects can be obtained in the sixth embodiment as in the fifth embodiment. Additionally, the sixth embodiment is applicable in cases where bonding between the outer layer 15 and the metal layer 13 is insufficient.

Electromagnetic Shielding Tube 3e

Figure 11A:
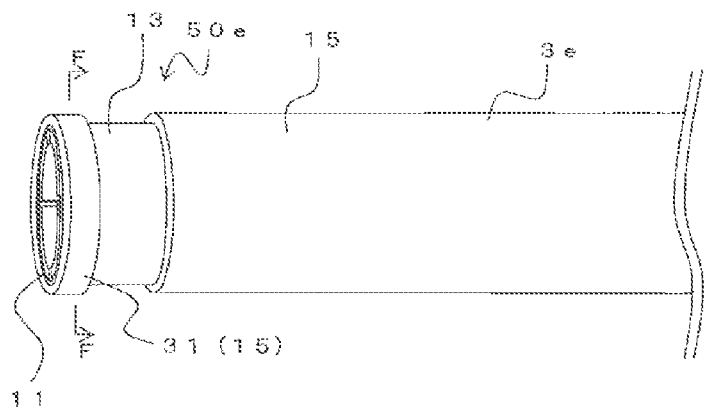
FIG. 11A is a perspective view illustrating an electromagnetic shielding tube 3e.
Figure 11B:
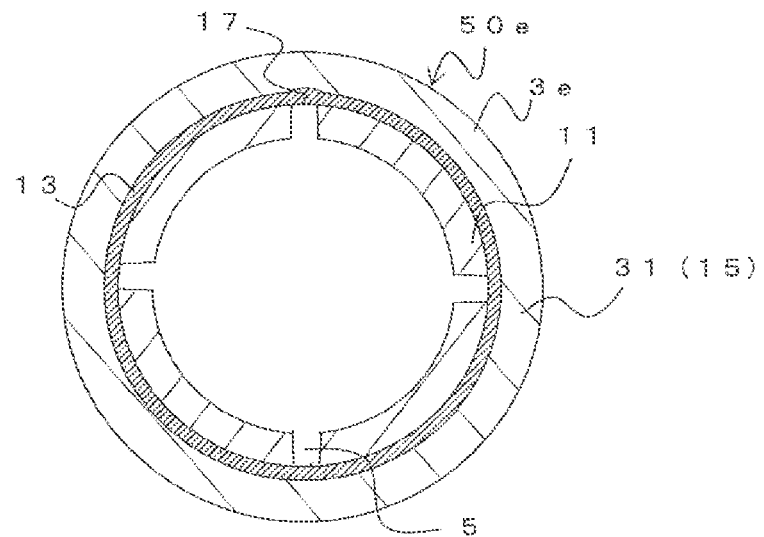
FIG. 11B is a cross-sectional view taken along line F-F of FIG. 11A.

Next, a seventh embodiment will be described. FIG. 11A is a perspective view illustrating an electromagnetic shielding tube 3e; FIG. 11B is a cross-sectional view perpendicular to a length direction of the electromagnetic shielding tube 3e, and is a cross-sectional view taken along line F-F of FIG. 11A. The electromagnetic shielding tube 3e is substantially the same as the electromagnetic shielding tube 3c, with the exception that the groove-like separated portion 5 of the electromagnetic shielding tube 3 described above is provided in the inner layer 11. The separated portion 5 is a structure for suppressing the transmission of stress caused by changes in temperature between the inner layer 11 and the metal layer 13. That is, in the electromagnetic shielding tube 3e, terminal processed portions 50e, namely the retaining portion 31 and the separated portion 5, are provided.

The same effects can be obtained in the seventh embodiment as in the fifth embodiment. Additionally, the terminal processed portions 50e, namely the retaining portion 31 and the separated portion 5 (stress transmission suppressing structures), which mitigate the effects caused by differences in the physical properties of the inner layer 11 and the metal layer 13, are provided on the exposed portion of the metal layer 13. As such, increases in contact resistance between the metal layer 13 and the flexible conductor 9 resulting from contraction of the metal layer 13 can be suppressed.

Note that, in the example described above, the separated portion 5 is formed in the electromagnetic shielding tube 3c, but may also be applied to the electromagnetic shielding tube 3d. Additionally, in order to suppress deformation in the diameter reduction direction of the metal layer 13 caused by the effects of creeping and the like of the inner layer 11, the separated portion 27 of the electromagnetic shielding tube 3a may be provided between the inner layer 11 and the metal layer 13 in the exposed range of the metal layer 13.

Electromagnetic Shielding Tube 3g

Figure 12A:
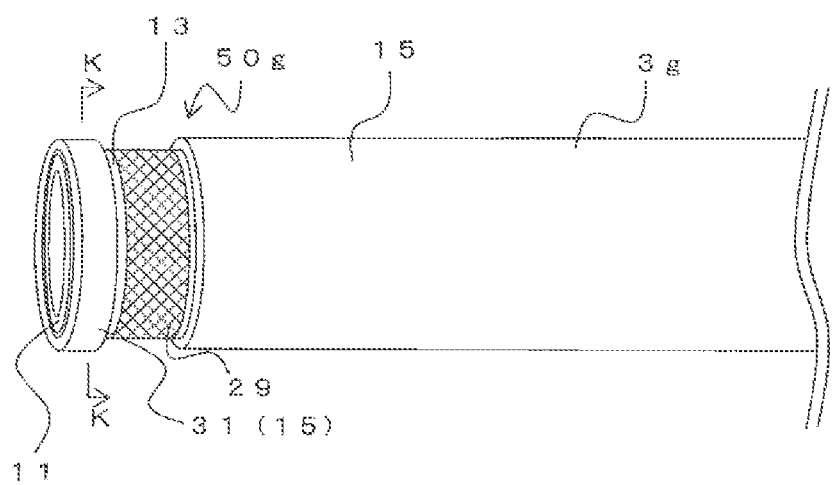
FIG. 12A is a perspective view illustrating an electromagnetic shielding tube 3g.
Figure 12B:
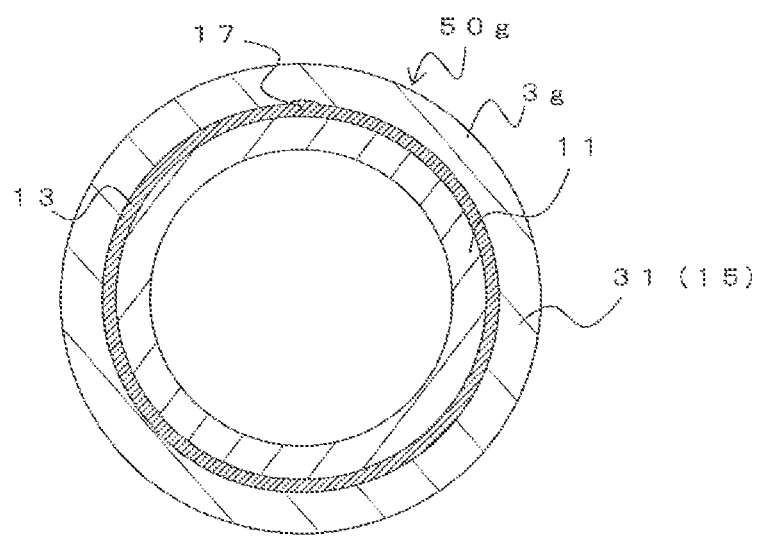
FIG. 12B is a cross-sectional view taken along line K-K of FIG. 12A.

Next, an eighth embodiment will be described. FIG. 12A is a perspective view illustrating an electromagnetic shielding tube 3g; FIG. 12B is a cross-sectional view perpendicular to a length direction of the electromagnetic shielding tube 3g, and is a cross-sectional view taken along line K-K of FIG. 12A. The electromagnetic shielding tube 3g is substantially the same as the electromagnetic shielding tube 3c, with the exception that, as with the electromagnetic shielding tube 3b, the uneven portion 29 is formed on the exposed portion of the metal layer 13. That is, in the electromagnetic shielding tube 3g, terminal processed portions 50g, namely the uneven portion 29 and the retaining portion 31, are provided.

The same effects can be obtained in the eighth embodiment as in the fifth embodiment. Additionally, the terminal processed portions 50g, namely the uneven portion 29 and the retaining portion 31, which mitigate the effects caused by differences in the physical properties of the inner layer 11 and the metal layer 13, are provided on the exposed portion of the metal layer 13. As such, increases in contact resistance between the metal layer 13 and the flexible conductor 9 resulting from contraction of the metal layer 13 can be suppressed.

Note that, in the example described above, the uneven portion 29 is formed in the electromagnetic shielding tube 3c, but may also be applied to the electromagnetic shielding tube 3d.

Electromagnetic Shielding Tube 3h

Figure 13A:
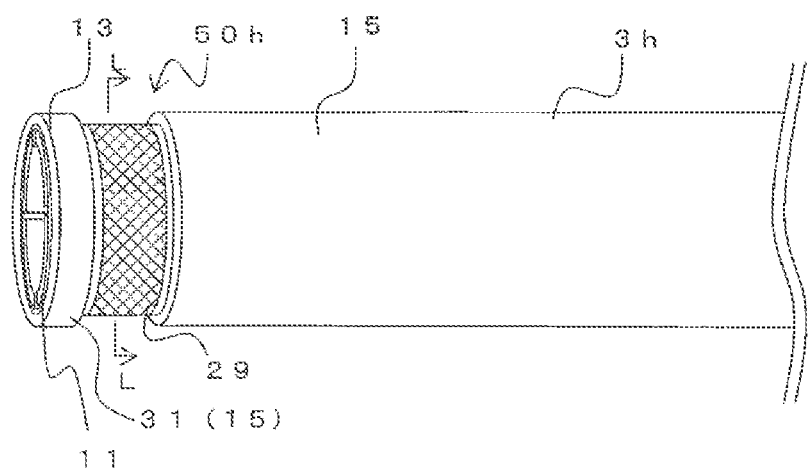
FIG. 13A is a perspective view illustrating an electromagnetic shielding tube 3h.
Figure 13B:
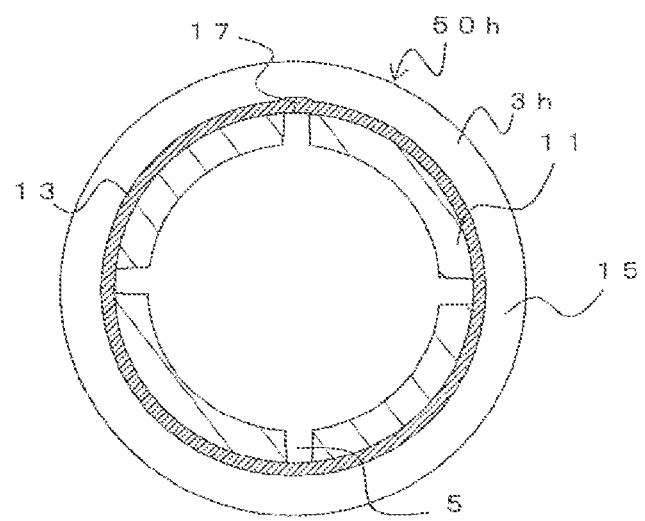
FIG. 13B is a cross-sectional view taken along line L-L of FIG. 13A.

Next, a ninth embodiment will be described. FIG. 13A is a perspective view illustrating an electromagnetic shielding tube 3h; FIG. 13B is a cross-sectional view perpendicular to a length direction of the electromagnetic shielding tube 3h, and is a cross-sectional view taken along line L-L of FIG. 13A. The electromagnetic shielding tube 3h is substantially the same as the electromagnetic shielding tube 3e, with the exception that, as with the electromagnetic shielding tube 3b, the uneven portion 29 is formed on the exposed portion of the metal layer 13. That is, in the electromagnetic shielding tube 3h, terminal processed portions 50h, namely the uneven portion 29, the separated portion 5, and the retaining portion 31, are provided.

The same effects can be obtained in the ninth embodiment as in the seventh embodiment. Additionally, the terminal processed portions 50h, namely the uneven portion 29, the separated portion 5, and the retaining portion 31, which mitigate the effects caused by differences in the physical properties of the inner layer 11 and the metal layer 13, are provided on the exposed portion of the metal layer 13. As such, increases in contact resistance between the metal layer 13 and the flexible conductor 9 resulting from contraction of the metal layer 13 can be suppressed.

Note that, in the example described above, the uneven portion 29 and the separated portion 5 are formed in the electromagnetic shielding tube 3c, but may also be applied to the electromagnetic shielding tube 3d. Additionally, in order to suppress deformation in the diameter reduction direction of the metal layer 13 caused by the effects of creeping and the like of the inner layer 11, the separated portion 27 of the electromagnetic shielding tube 3a may be provided between the inner layer 11 and the metal layer 13 in the exposed range of the metal layer 13.

Electromagnetic Shielding Tube 3i

Figure 14A:
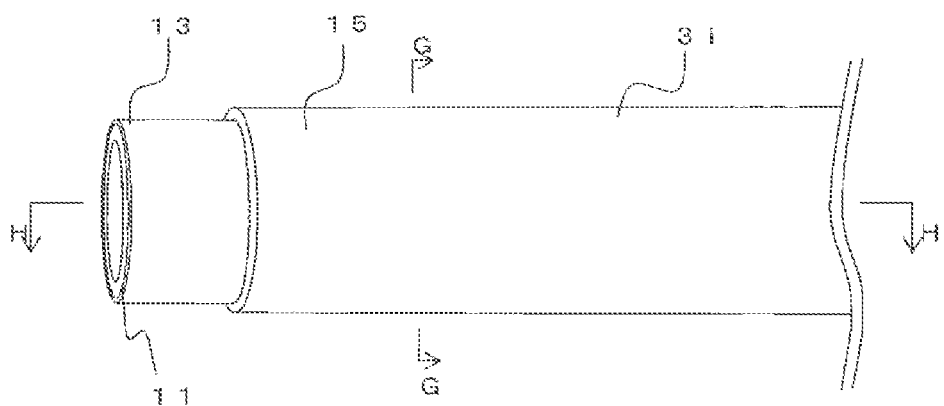
FIG. 14A is a perspective view illustrating an electromagnetic shielding tube 3i.
Figure 14B:
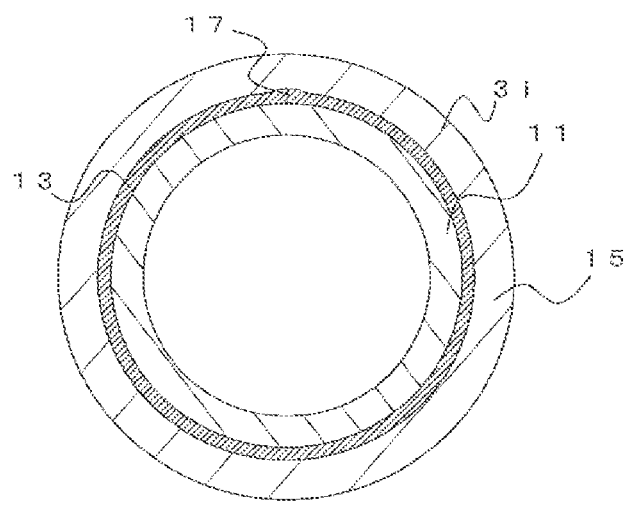
FIG. 14B is a cross-sectional view taken along line G-G of FIG. 14A.
Figure 15A:
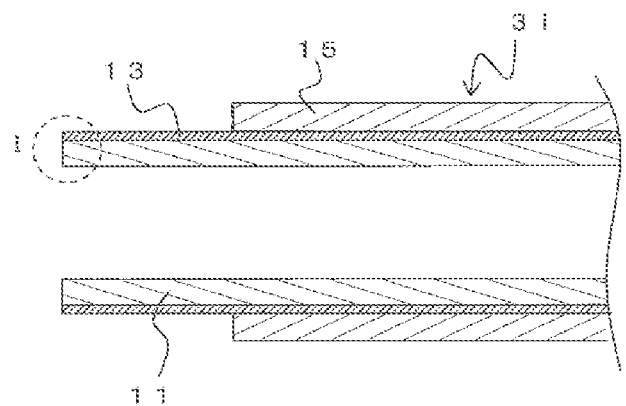
FIG. 15A is a cross-sectional view in a length direction of the electromagnetic shielding tube 3i, and is a cross-sectional view taken along line H-H of FIG. 14A.

Next, a tenth embodiment will be described. FIG. 14A is a perspective view of an electromagnetic shielding tube 3i; FIG. 14B is a cross-sectional view perpendicular to a length direction of the electromagnetic shielding tube 3i, and is a cross-sectional view taken along line G-G of FIG. 14A. FIG. 15A is a cross-sectional view in the length direction of the electromagnetic shielding tube 3i, and is a cross-sectional view taken along line H-H of FIG. 14A.

The outer layer 15 is peeled exactly a predetermined length from the end portion of the electromagnetic shielding tube 3i. That is, the metal layer 13 is exposed exactly a predetermined range at the end portion of the electromagnetic shielding tube 3i. A flexible conductor is connected to the exposed metal layer 13.

The electromagnetic shielding tube 3i is manufactured via the same method used for the electromagnetic shielding tube 3 and the like described above, the tube body is manufactured and is cut to a predetermined length, and the outer layer 15 at the end portion vicinity thereof is removed. Thus, the electromagnetic shielding tube 3i including a connecting portion is completed. Here, cut burrs are commonly formed when cutting the tube body and it is of particular importance that cut burrs of the metal layer 13 are machined so as not to protrude to the outer surface side or inward from the inner surface of the tube. Typically, in order to remove cut burrs, machining is performed using a tool or the like to remove the cut burrs after the cutting but, from the perspective of process streamlining, it is preferable that this problem be resolved during the cutting process.

Figure 15B:
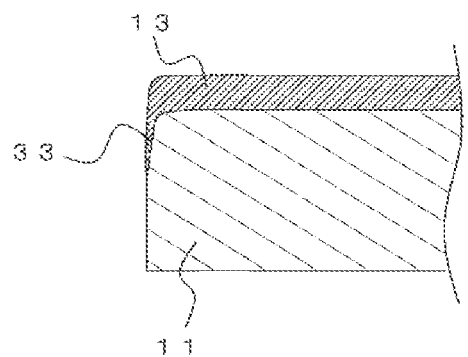
FIG. 15B is an enlarged view of section I of FIG. 15A.

FIG. 15B is an enlarged view of section I of FIG. 15A. In the present embodiment, a cut burr 33 of the metal layer 13 is formed on the inner layer 11 side throughout the entire periphery, but is not formed on the outer layer 15 side. A preferable example of means for making such a cut is a cutting means that performs uniform cutting throughout the entire periphery of the metal layer 13, from the outer side toward the inner side. A pipe cutter is a known, specific example of these means, and cuts while a rotating blade, for example, moves from the outer side of the tube toward the inner side. Use of such means in the present embodiment is advantageous. By processing in this manner, the process of removing cut burrs can be eliminated.

A height (protruding height from the inner surface of the metal layer 13 toward the inner layer 11 side) of the cut burr 33 is less than the thickness of the inner layer 11. As such, the tip of the cut burr 33 will not be exposed on the inner surface of the inner layer 11.

As described above, the flexible conductor 9 is arranged on the outer periphery of the exposed portion of the metal layer 13. In this case, the cut burr 33 does not protrude to the outer peripheral surface of the metal layer 13. As such, the flexible conductor 9 does not contact to cut burr 33. Thus, the flexible conductor 9 can be prevented from becoming broken by the cut burr 33.

The height of the cut burr 33 is less than the thickness of the inner layer 11 and, as such, the tip of the cut burr 33 does not protrude to the inner surface side of the inner layer 11. As a result, the electric wire 21 that passes through the interior of the inner layer 11 will not be damaged by the cut burr 33.

Thus, according to the tenth embodiment, the cut burr 33 of the metal layer 13 are formed on the inner layer 11 side and, as such, the flexible conductor 9 can be prevented from becoming broken by the cut burr 33.

Additionally, due to the fact that the cut burr 33 does not protrude to the inner surface side of the inner layer 11, the electric wire 21 will not catch on the cut burr 33 when inserting the electric wire 221 into the electromagnetic shielding tube 3 or the like, and the electric wire 21 will not be damaged by the cut burr 33.

Note that this configuration in which the cut burr 33 does not protrude to the inner surface side of the inner layer 11 or the exposed portion of the metal layer 13 can be applied to the electromagnetic shielding tubes 3 to 3h as well. That is, for the electromagnetic shielding tubes 3 to 3h described above as well, when cutting the tube body, a cutting means is preferable that performs uniform cutting throughout the entire periphery of the metal layer 13, from the outer side toward the inner side.

Although embodiments have been described above with reference to the accompanying drawings, the technical scope of the present disclosure is not limited by the above-described embodiments. It will be apparent to those skilled in the art that various variations and modifications can be made to the described embodiments that are within the scope of the technical ideas recited in the appended claims. Thus, it is intended that these variations and modifications are within the technical scope of the claims.

The invention claimed is:

1. An electromagnetic shielding tube through which an electric wire can be inserted, the electromagnetic shielding tube comprising:
   an inner layer made of resin;
   a metal layer formed on an outer periphery of the inner layer; and
   an outer layer made of resin, formed on an outer periphery of the metal layer; wherein
   the metal layer is exposed at an end portion or an end portion vicinity of the electromagnetic shielding tube;
   a terminal processed portion configured to mitigate effects caused by differences in physical properties of the inner layer and the metal layer is provided on an exposed portion of the metal layer; wherein:
   the terminal processed portion is a stress transmission suppressing structure configured to, in at least a portion of the inner layer, suppress radial forces of the inner layer generated due to changes in temperature from being transmitted to the metal layer,
   the stress transmission suppressing structure is a separated portion formed in the inner layer, and
   in a cross-section perpendicular to a length direction of the electromagnetic shielding tube, the inner layer is divided into a plurality of sections in the circumferential direction by the separated portion.

2. The electromagnetic shielding tube according to claim 1, wherein the terminal processed portion is an uneven shape formed on an outer surface of at least a portion of the exposed portion of the metal layer.

3. The electromagnetic shielding tube according to claim 2, wherein raised portions of the uneven shape are positioned higher than an unprocessed surface of the metal layer.

4. The electromagnetic shielding tube according to claim 1, wherein:
   the metal layer is exposed in an annular shape at the end portion vicinity of the electromagnetic shielding tube; and
   the terminal processed portion is a retaining portion configured to prevent a conductor, which is provided on an outer peripheral surface of the metal layer on a tip side of the exposed portion of the metal layer and is connected to the metal layer, from falling off.

5. The electromagnetic shielding tube according to claim 4, wherein the retaining portion is a portion of the outer layer.

6. The electromagnetic shielding tube according to claim 4, wherein the retaining portion is a tube fixed on the tip side of the exposed portion of the metal layer.

7. The electromagnetic shielding tube according to claim 4, wherein the retaining portion is resin disposed on the tip side of the exposed portion of the metal layer.

8. An electromagnetic shielding structure, comprising:
   an electromagnetic shielding tube through which an electric wire can be inserted;
   a flexible conductor attached to the electromagnetic shielding tube; and
   a ring member holding the flexible conductor; wherein
   the electromagnetic shielding tube comprises:
   an inner layer made of resin;
   a metal layer formed on an outer periphery of the inner layer; and
   an outer layer made of resin, formed on an outer periphery of the metal layer;
   the metal layer is exposed at an end portion of the electromagnetic shielding tube; and a terminal processed portion configured to mitigate effects caused by differences in physical properties of the inner layer and the metal layer is provided on an exposed portion of the metal layer; wherein the flexible conductor is arranged on the exposed portion of the metal layer, the flexible conductor is secured to the electromagnetic shielding tube from an outer periphery of the flexible conductor by the ring member, the terminal processed portion is a stress transmission suppressing structure configured to, in at least a portion of the inner layer, suppress radial forces of the inner layer generated due to changes in temperature from being transmitted to the metal layer, the stress transmission suppressing structure is a separated portion formed in the inner layer, and in a cross-section perpendicular to a length direction of the electromagnetic shielding tube, the inner layer is divided into a plurality of sections in the circumferential direction by the separated portion.

9. The electromagnetic shielding structure according to claim 8, wherein:

the terminal processed portion is an uneven shape formed on an outer surface of at least a portion of the exposed portion of the metal layer; and the flexible conductor is arranged on an outer peripheral surface of the uneven shape.

10. The electromagnetic shielding structure according to claim 9, wherein raised portions of the uneven shape are positioned higher than an unprocessed surface of the metal layer.

11. The electromagnetic shielding structure according to claim 8, wherein:

the metal layer is exposed in an annular shape at the end portion vicinity of the electromagnetic shielding tube; and the terminal processed portion is a retaining portion configured to prevent a conductor, which is provided on an outer peripheral surface of the metal layer on a tip side of the exposed portion of the metal layer and is connected to the metal layer, from falling off.

12. The electromagnetic shielding structure according to claim 11, wherein the retaining portion is a portion of the outer layer.

13. The electromagnetic shielding structure according to claim 11, wherein the retaining portion is a tube fixed on the tip side of the exposed portion of the metal layer.

14. The electromagnetic shielding structure according to claim 11, wherein the retaining portion is resin disposed on the tip side of the exposed portion of the metal layer.

* * * * *